United States Patent [19]

Iwase et al.

[11] Patent Number: 4,659,611
[45] Date of Patent: Apr. 21, 1987

[54] CIRCUIT SUBSTRATE HAVING HIGH THERMAL CONDUCTIVITY

[75] Inventors: Nobuo Iwase, Kamakura; Kazuo Anzai, Tokyo; Kazuo Shinozaki, Inagi; Akihiko Tsuge, Yokohama; Kazutaka Saitoh, Kawasaki; Kiyoshi Iyogi, Tokyo; Noboru Sato, Yokohama; Mitsuo Kasori, Kawasaki, all of Japan

[73] Assignee: Kabushiki Kaisha Toshiba, Kawasaki, Japan

[21] Appl. No.: 706,280

[22] Filed: Feb. 27, 1985

[30] Foreign Application Priority Data

Feb. 27, 1984 [JP] Japan ................................. 59-34163
Feb. 27, 1984 [JP] Japan ................................. 59-34165
Oct. 1, 1984 [JP] Japan ................................. 59-204101
Nov. 15, 1984 [JP] Japan ................................. 59-239471

[51] Int. Cl.$^4$ ...................... C04B 35/52; C04B 35/58; B32B 15/04; B32B 5/16
[52] U.S. Cl. .................... 428/209; 428/210; 428/698; 428/699; 428/901; 501/96; 501/98
[58] Field of Search ................... 501/96, 98; 428/698, 428/699, 901, 209, 210; 106/1.18; 428/328

[56] References Cited

U.S. PATENT DOCUMENTS

| 3,607,613 | 9/1971 | Passmore et al. | 428/698 X |
| 3,922,475 | 11/1975 | Manasevit | 428/698 X |
| 4,070,518 | 1/1978 | Hoffman | 428/901 X |
| 4,072,771 | 2/1978 | Grier, Sr. | 428/901 X |
| 4,219,448 | 8/1980 | Ross | 106/1.18 X |
| 4,273,822 | 6/1981 | Bube | 428/328 X |
| 4,435,513 | 3/1984 | Komeya et al. | 501/96 |
| 4,457,861 | 7/1984 | Des Marais, Jr. | 106/1.18 X |
| 4,478,785 | 10/1984 | Huseby et al. | 501/98 X |
| 4,519,966 | 5/1985 | Aldinger et al. | 264/65 X |

OTHER PUBLICATIONS

Werdecker et al., "Aluminium Nitride-An Alternative Ceramic Substrate for High Power Applications in Micro Circuits", IEEE, May 1984, pp. 402–406.

Primary Examiner—Nancy Swisher
Attorney, Agent, or Firm—Schwartz, Jeffery, Schwaab, Mack, Blumenthal & Evans

[57] ABSTRACT

A high thermal conductivity circuit substrate is provided comprising a sintered aluminum nitride ceramic substrate consisting essentially of one member selected from the group of yttrium, the rare earth metals and the alkali earth metals and an electrically conductive thick film paste for a conductive layer formed on the substrate.

25 Claims, No Drawings

CIRCUIT SUBSTRATE HAVING HIGH THERMAL CONDUCTIVITY

FIELD OF THE INVENTION

This invention relates to a circuit substrate, more specifically, to a high thermal conductivity circuit substrate made of aluminum nitride ceramic substrate (to be referred to below as AlN substrate).

BACKGROUND OF THE INVENTION

Until now most circuit substrates have been made of ceramic substrates such as $Al_2O_3$ substrate or resin substrate. In particular, $Al_2O_3$ substrate has superior mechanical strength and electrical insulation properties and in addition can be easily made into green sheets, which makes high-density wiring such as multi-layered wiring possible, so it has found wide use. However, the thermal conductivity of $Al_2O_3$ is low, only about 20 W/mK.

In recent years, as electronic devices have become smaller, the packaging density of electronic devices (such as ICs) mounted on a circuit substrate has increased. In addition, power semiconductors are being used. Consequently, a great deal of heat is produced by the electronic devices, making it necessary for the circuit substrate to radiate heat away efficiently. However, since the thermal conductivity of $Al_2O_3$ is low, when a great deal of heat is produced, it is impossible to expect much of it to be radiated away from the circuit substrate. Consequently, when mounting electronic devices in a high density packaging configuration or producing modules containing power semiconductors, it is desirable to have a circuit substrate which has high thermal conductivity in addition to mechanical strength and good electrical insulation.

Meanwhile, in recent years, with progress in fine ceramics technology, ceramic materials such as SiC and AlN having superior mechanical strength have been developed. These materials have superior thermal conductivity and much research has been done on applying them as structural materials. Since SiC with 0.5 to 3 wt % BeO has good thermal conductivity, there are some efforts being made to use SiC as a circuit substrate material. However, SiC has a high dielectric constant and low dielectric strength, so there are serious problems in using it for high-frequency circuit devices and for devices to which high voltage will be applied.

Aluminum nitride (AlN) is improved over the alumina ceramic with respect to characteristics required as circuit substrates because it has an outstandingly high thermal conductivity of at least 40 W/mk, for example, 100 W/mk as compared with 20 W/mk for alumina, a mechanical strength of 40 to 50 $kg/mm^2$ (25 $kg/mm^2$ for alumina), and a dielectric strength of 140 to 170 kV/cm (100 kV/cm for alumina). It is desired to manufacture high thermal conductivity circuit substrates by taking advantage of such favorable characteristics of AlN ceramic.

Because of good electric insulation as well as thermal conductivity, AlN substrates would find a promising application as circuit substrates. AlN was, however, believed difficult to bond a conductive layer thereto because of its poor wettability by metal as evidenced by its use as crucibles for melting metallic aluminum. There is no circuit substrate having a conductive layer formed directly on an AlN substrate. AlN ceramic has found the only application as a heat sink on which power semiconductors such as thyristors are secured with organic adhesive.

Since AlN ceramic is hardly adhered to metals, it is difficult to use such as copper, silver, silver-platinum etc. on the ceramic for a circuit substrate.

Japanese Patent Publication of Unexamined Application Nos. 52-37914 and 50-132022 disclose techniques of directly bonding a copper plate to ceramic. Although a conductive layer might be formed on an AlN substrate using these techniques, a limitation is imposed on the formation of a fine pattern and great difficulty is encountered in providing multilayer wiring necessary in high density packages.

In addition, AlN ceramic has poor wettability by glass, so that when a glass layer is formed directly on an AlN substrate without an intervening oxide layer which is described hereinafter, bubbles are introduced into the glass layer so that a strong bond cannot be established. It is believed that bubble formation is due to evolution of gases such as ammonia gas from the AlN substrate heated to elevated temperatures in air.

The thick film pastes which may be used in circuit substrates include a variety of pastes commonly used in forming conductive and resistive layers and containing as a conductor a metal, metal oxide and the like, for example, Au, Ag, Pt, Cu, Ni, Ru, $RuO_2$, $Bi_2Ru_2O_7$ etc. Examples of the conductive pastes which may be used include usual Ag, Au, Cu, Ni, Al pastes. Examples of the resistive pastes which may be used include $RuO_2$ paste, $LaF_6$, $YB_6$, $CaB_6$, $BaB_6$, $SrB_6$ paste, and the like.

It is also possible to use a dielectric paste consisting mainly of lead borosilicate glass ($PbO$-$SiO_2$-$B_2O_3$) to form the dielectric layer for multi-layered wiring. It is desirable for such a glass compound to contain PbO to increase the bond strength.

The thick film pastes generally contain a solvent for slurry formation, a binder and a component contributing to bonding in addition to the conductive powder as a main component.

Since a pattern of electrically conductive paths or layers can be formed from such a thick film paste, finely detailed circuit design becomes possible. In addition, when devices such as power semiconductors producing a great deal of heat are to be used, it is possible to, for example, form the principal electrically conductive paths or layers from thick film paste and connect the devices to, for example, a copper plate bonded to the AlN substrate. Such bonding can, for example, be performed using technology in Patent Publication of Unexamined Application Nos. Sho-52-37914 and Sho-50-132022.

The bond structures to ceramic substrate include the chemical bond type where a chemical bond is formed, the glass bond type based on glass adhesion, and the mixed bond type which is a mixture of these types. The thick film pastes for use in circuit substrates are of the chemical bond type or based on the chemical bond type and basically do not contain a glass component although a glass component may be contained as long as it does not adversely affect the chemical bond. When the glass component is contained in a paste, cracks and other defects readily occur during baking due to the difference in coefficient of thermal expansion, bonding force is lessened, and electric resistance is increased.

SUMMARY OF THE INVENTION

This invention was conceived with the above points in mind, the purpose of which is to provide a circuit substrate which has the required electrical characteristics such as high electrical resistivity and high dielectric strength, and in addition has superior thermal conductivity.

Another purpose of this invention is to provide a high thermal conductivity circuit substrate having an electrically conductive path or layer made of electrically conductive paste on an AlN substrate.

Another purpose of this invention is to provide a AlN circuit substrate on which it is possible to bond a conductive layer and a glass layer.

The above objectives have been achieved by first producing a sintered aluminium nitride ceramic substrate consisting essentially at least one member selected from the group of yttrium, rare earth metals(lanthanum, cerium, praesodymium, neodymium, samarium, gadolinium, dysprosium, etc.) and alkali earth metals (calcium, strontium, barium, etc.) the balance being essentially aluminium nitride and incidental impurities, and then forming a conductive path or layer made of electrically conductive thick film paste directly on the substrate. The member or members becomes oxides during the subsequent sintering or firing.

Further, these circuit substrates are improved in bonding characteristics by forming an oxide layer on the surface of the AlN substrate, or using pastes including $Cu_2O$, Pb or Si.

The term "circuit substrates" of the present invention means to include all the substrates containing a wiring pattern such as circuit substrates for mounting components, IC chip packages, IC chip carriers.

DESCRIPTION OF THE INVENTION

The inventors have investigated applications of a circuit substrate made of an AlN substrate, which has superior electrical resistivity and dielectric strength and in addition has better thermal conductivity than other materials such as $Al_2O_3$.

The theoretical thermal conductivity of AlN is 300 W/mK, which is very good, making it useful as a circuit substrate material having high thermal conductivity.

In order to obtain the required thermal conductivity etc., the AlN powder material desirably contains oxygen in the range up to 7% by weight.

A sintered ceramic substrate essentially consisting of AlN alone has poor wetting properties with respect to metal, but we have found that the wetting properties can be improved by producing a sintered aluminium nitride ceramic substrate consisting essentially of one member selected from the group of yttrium, rare earth metals (lanthanum, cerium, praseodymium, neodymium, samarium, gadolinium, dysprosium, etc.) and alkali earth metals (calcium, strontium, barium etc.) the balance being essentially aluminium nitride and incidental impurities, improving substantially the high thermal conductivity which is the major advantage of AlN. The electrically conductive path or layer can then be formed by using an electrically conductive thick film paste.

Thus, a high thermal conductivity circuit substrate can be produced by forming electrically conductive paths or layers of electrically conductive paste on a sintered aluminium nitride ceramic substrate consisting essentially of at least one member selected from the group of yttrium, the rare earth metals and the alkali earth metals the balance being essentially aluminium nitride and incidental impurities. This AlN substrate can be sintered at atmospheric pressure, which is advantageous in cost.

The member or additive is added in the form of oxides or carbonates which become oxides during sintering or firing.

These members or additives are believed to exist in the form of oxides, complex oxides, etc. in the ceramic substrate. Such additives have previously been known as additive for sintering in the art, but the present inventors have discovered that they increase the thermal conductivity and improve the wetting properties with respect to metal.

Such additives (for example, yttrium oxide, rare earth metal oxides, alkali earth metal carbonates, etc.), when added in small amounts, improve the wetting properties of the ceramic substrate with respect to metal. For this purpose, the content of additive should be at least about 0.01% by weight of metal element equivalent. The amount of additive in terms of metal element equivalent should not exceed about 15% by weight as such a large amount will reduce the thermal conductivity.

Accordingly, the "AlN substrate" used hereinafter may contain such additives.

There are other additives such as NiO and $Al_2O_3$ which might be added to the ceramic substrate. There is no problem if they are added in the form of compounds with one or more of the additives mentioned above, but if they are used independently, they will cause a reduction of the thermal conductivity and prevent the wetting properties of the ceramic substrate with respect to metal from being improved, so they are not particularly effective as additives.

We have further found that a strong bond is accomplished at relatively lower temperatures of 800° C. to 900° C. when a thick film paste contains lead (Pb) or silicon (Si), and that when a conductive layer is formed using such a thick film paste, a bond layer in which at least one of Pb and Si coexists with O is formed between the conductive layer and the AlN substrate.

With respect to the bonding between Pb and/or Si and O in this bonding layer, the thinness of the layer itself makes it difficult to analyze the compound these elements form and the mechanism of creating a strong bond. However, it is believed that there is probably formed a complicated compound of (Pb, Si)-O which serves to firmly bond the AlN substrate with the main component of the thick film paste, for example, Au, Cu, etc.

The extreme thinness of the bonding layer makes it difficult to determine its absolute thickness, but a thickness of the order of several microns, and more specifically 0.5 to 20 $\mu m$ may generally suffice. Too thick layers are rather liable to peeling.

The content of Pb, Si, and O in the bonding layer cannot be specified because of difficulty in analysis although it is empirically confirmed that the only requirement is the coexistence of at least one of lead and silicon with oxygen.

In order to form such a bonding layer, at least one of lead and silicon may be contained in a thick film paste. Oxygen may be supplied by adding lead or the like in the form of oxide, or from an organic substance such as a binder in the paste, or by baking in an oxidizing atmosphere. Oxygen may also be previously contained in the AlN substrate. Such oxygen inclusion may be carried out by various methods including the use of an oxygen-containing stock material, the addition of an oxide such as $Y_2O_3$, and surface oxidation.

When such a thick film paste is used and baked, Pb, Si and O atoms migrate toward and concentrate at the bonding interface to form a bonding layer in which Pb and Si coexist with O. The effective contents of lead and silicon in the thick film paste required to form the bonding layer may be low and a significant effect is obtained at contents of at least about 0.005 wt % (calculated as metal element). The upper limit is about 5 wt % (calculated as metal element) because too higher contents increase the electric resistance of the conductive layer without a substantial increase in bond strength. Lead can be partially reduced and precipitate as metallic lead during baking. This results in reduced moisture resistance as circuit substrates. Precipitation of metallic lead is quite probable in the case of baking in a reducing atmosphere. For this reason, the lead content may preferably be not more than 4 wt % (calculated as metal element).

The inventors also discovered that an electrically conductive path or layer can be formed directly on the AlN substrate by using a conductive thick film paste which contains copper oxide. The thick film paste containing copper oxide forms a compound oxide layer at the interface consisting of $CuAlO_2$, $CuAl_2O_4$, etc. This is believed to produce a stronger bond than is formed by other pastes. If the bond strength is at least 1 kg/mm$^2$, it is adequate for practical use; this invention satisfies this requirement easily. Copper oxide is required in only a small amount to produce this effect. To provide the bond strength, copper oxide should be present in an amount of at least about 0.1% by weight ($Cu_2O$ equivalent). On the other hand, if there is too much, the electrical resistivity will be increased, so the $Cu_2O$ equivalent amount should not exceed about 30% by weight.

In addition, we have found that the formation of an oxide layer on aluminum nitride can improve the wettability by metal to allow a conductive layer to be formed thereon. We have also found that a glass layer formed on an AlN substrate with an intervening oxide layer is free of bubbles and finally bonded to the substrate.

The bondability of a glass layer to an AlN substrate is very important as circuit substrates. In the case of sealing, for example, where a cap must be joined to a substrate, sealing with glass may be employed. For the adhesion between a lead frame and a substrate, glass bonding may be employed. Further, in the case of printed multilayer packages wherein a dielectric layer is necessary for interlayer insulation, a glass layer may be utilized as the dielectric layer.

The glass layers which may be used in the practice of the present invention may generally be selected from those used on alumina substrates. For example, glasses of $PbO-SiO_2-B_2O_3$, $BaO-SiO_2-B_2O_3$ and similar systems may be used. In consideration of the influence of the glass layer on the AlN substrate, for example, a change in the oxidation state of the AlN substrate, a glass having a softening point of 350° to 950° C. may be applied at a temperature of about 400° to 1000° C.

The use of an AlN substrate having an oxide layer allows a bubble-free thick film pattern to be formed on the substrate. Particularly when a resistive thick film pattern is formed, an advantage is obtained in that its resistance is reproduceable.

A particular advantage in forming the oxide layer is obtained when resistors are formed on a substrate. Since resistive paste generally has conductive particles dispersed in glass matrix, glass bonding must be satisfactorily accomplished. In the case of resistors, it is important for circuit design and the like that their resistance is reproduceable. When an AlN substrate used without an oxide layer, bubbles are introduced in a resistor in the form of a glass layer as mentioned above, resulting in an inconsistent resistance. The provision of an oxide layer on an AlN substrate allows a good bond to be achieved without bubbles and hence, a resistor to be formed with a highly reproduceable or consistent resistance.

The oxide layer mentioned above may preferably be at least about 0.5 μm thick because thinner layers are not effective in providing the desired strength of bond between the glass layer and the AlN substrate. The oxide layer may preferably be not more than about 100 μm thick because when too thick, it can be peeled off due to the difference in thermal expansion between the oxide layer and the AlN substrate. Since the oxide layer is comprised of alumina, boehmite, or the like and has a lower thermal conductivity than AlN, it may be as thin as possible insofar as a substantially equivalent bond strength is achievable, and most preferably of the order of 2 to 20 μm.

The oxide layer may be formed on the AlN substrate, for example, by a treatment in air at elevated temperatures. The thickness of the oxide layer being formed varies with temperature and time of this heat treatment. The treating time may become shorter as the temperature of the heat treatment rises. The heat treatment may preferably be carried out at about 1000° to 300° C. for about 0.5 to 3 hours. Other methods which may be used herein include a heat treatment in an oxidizing atmosphere, for example, steam (at relatively lower temperatures in the range of about 100° to 140° C. than in air, preferably under increased pressures of, for example, 2 to 3 atmospheres), immersion in acidic solution, and the like.

As shown in the foregoing examples, the formation of an oxide layer on an AlN substrate allows for bonding of a conductive layer and bonding of a glass layer, enabling the manufacture of a high thermal conductivity circuit substrate from AlN while taking full advantage of its high thermal conductivity, high dielectric strength, and mechanical strength.

The AlN substrate including additives as mentioned previously can be processed in a manner similar to that used in processing the substantially pure AlN substrate as explained in the following description.

As to the additive of $Cu_2O$, pressing was performed on AlN powders in $N_2$ gas at 1800° C., 300 kg/cm$^2$ to obtain an AlN substrate measuring 2×40×20 mm$^3$, and a circuit pattern was formed on this substrate using a silver - palladium paste of chemical bond type containing $Cu_2O$ (ESL 9601). A 325 mesh emulsion thickness 20 μm stainless steel screen was used to form 2×2 mm, 3×3 mm and 4×4 mm printed pads. The substrate was then dried for 20 minutes at 120° C. and fired in a tunnel furnace at a peak temperature of 930° C.

Next, the pad is coated with rosin flux and immersed in a tank of solder containing, by weight, 2% silver, 63% tin, 35% lead at 240° C. and soldered to test wires having tensile strength up to about 8 kg. Then the bond strength was investigated.

The bond strength was tested using an Instron tensile tester at a tensile pulling rate of 0.5 cm/min.

The results are shown in Table 1. Since the measurements on the 4×4 mm and 3×3 mm pads failed due to wire breakage, only the results for the 2×2 mm pad are shown.

TABLE 1

| Pad No. | 1 | 2 | 3 | 4 | 5 | 6 | 7 |
|---|---|---|---|---|---|---|---|
| Tension (kg) | 7.25 | 7.15 | 4.8 | 7.52 | 5.2 | 4.12 | 7.36 |
| Bond Strength (kg/mm$^2$) | 1.81 | 1.79 | 1.20 | 1.88 | 1.30 | 1.03 | 1.84 |

As is clear from Table 1, in all cases the bond strength is more than 1 kg/mm$^2$, which is suitable for a circuit substrate. Consequently, it is possible to make use of the high thermal conductivity of AlN to produce a high thermal conductivity circuit substrate.

Analysis of the adhesion interface showed that a layer of $CuAlO_2$ and/or $CuAl_2O_4$ was formed on top of the AlN, on top of which a eutectic Ag-Cu layer was formed, and on top of which an Ag-Pd layer was.

The $CuAlO_2$ and/or $CuAl_2O_4$ layer is thought to be formed through the reaction of the copper in the paste with the aluminum in the AlN. Also, aluminum oxide is thought to exist on the surface of the AlN substrate; this aluminum oxide is thought to combine with copper and copper oxide in the paste. In addition, the eutectic layer is strongly bound to the $CuAlO_2$ and/or $CuAl_2O_4$ layer and to the Ag-Pd layer, increasing the overall bond strength.

A semiconductor device was mounted on the circuit substrate produced as mentioned above. The ability of the circuit substrate to withstand changing environment was tested by exposing it to a heat cycle consisting of 30 minutes at −60° C. followed by 5 minutes at normal temperature followed by 30 minutes at +125° C. It was found that there was nothing abnormal after exposure to 150 such cycles.

For comparison a sample was prepared as follows;

The AlN powder as described above was subjected to forming and hot-pressing in a nitrogen gas atmosphere at 1800° C. and 300 kg/cm$^2$ pressure. The substrate which was obtained has a thermal conductivity of 70 W/mK, which is better than that of $Al_2O_3$. However, when gold paste was fired on, the bond formed was so weak that the gold paste could be easily scraped off with a fingertip.

As to the additive of lead and silicon, an AlN substrate was prepared by molding AlN powder followed by hot press sintering in a nitrogen gas atmosphere under conditions: 1800° C., 300 kg/mm$^2$, and 2 hours, and a pattern was formed from an Au paste containing PbO and $SiO_2$ (1.49 wt % Pb element and 0.23 wt % Si element) through a 250 mesh screen, dried in air at 120° C. for 10 minutes, and baked in air at 850° C. for 10 minutes, forming a pad (2×2 mm, six samples) which served as a conductive layer.

The pad was then coated with a rosin-based flux and immersed in a solder (2% Ag/63% Sn/35% Pb) bath at 240° C. to previously apply the solder. Test wires were soldered to determine the bond strength. The bond strength was measured using an Instron tensile tester at a pulling speed of 0.5 cm/min.

The measured bond strengths were 2.3 kg/mm$^2$ at maximum, 1.5 kg/mm$^2$ at minimum, and 2 kg/mm$^2$ on average, indicating a firm bond.

The bonding state was examined by XMA (X-ray microanalyzer) planar analysis to find that Pb, Si, and O atoms concentrated at the bonding interface to form a bonding layer. Oxygen and other atoms concentrated in the bonding layer of about 5 μm width. No glass component was formed. It was thus found that baking caused $SiO_2$ and PbO which had been uniformly present in the paste to migrate toward the bonding interface, contributing to the establishment of a firm bond. The migration of Si and Pb atoms resulted in the increased Au purity at the surface of the conductive layer which provided increased wire bonding force, offering a additional advantage.

Since, as stated above, the wetting properties with respect to metal of the ceramic substrate of the present invention are improved by the effect of the additives, thick film paste can generally be used as the electrically conductive paste to form the electrically conductive paths or layers on the substrate, as stated above. Different types of thick film paste which form bonds in different ways such as glass bond type and chemical bond type can be applied to the ceramic substrate. These thick film pastes form complicated compounds with the above-mentioned additives in the AlN substrate, thus providing a strong bond.

This invention permits a pattern of electrically conductive paths or layers having adequate bond strength for practical purposes to be formed on the AlN substrate. Consequently, the resulting AlN substrate has much higher thermal conductivity than other substrates such as alumina and also has superior dielectric strength, so it is suitable for the circuit substrate which generates a great deal of heat, such as power semiconductor package and high density package.

In addition, since the electrically conductive paths or layers can be formed with thick film paste, it can be used for finely detailed circuit patterns.

The novel features and advantages of this invention will be further evident from the following illustrative but not limiting examples of our actual applications of the invention.

EXAMPLE I

Yttrium oxide in an amount of 3% of elemental yttrium equivalent by weight was added to AlN powder. After mixing and forming, the resultant product was sintered in a nitrogen gas atmosphere at 1800° C. under atmospheric pressure to produce an AlN substrate.

Various thick film pastes were used as shown in the following examples to form electrically conductive paths on this AlN substrate, and the bond strengths were measured. The results are summarized in Table 2.

TABLE 2

| Paste | | Bond Strength (kg/mm$^2$) | | |
|---|---|---|---|---|
| | | maximum | minimum | average |
| Gold paste | (1) | 2.3 | 1.45 | 1.95 |
| Silver-palladium paste | (2) | 2.1 | 1.14 | 1.65 |
| Copper paste | (3) | 1.9 | 1.1 | 1.42 |
| Dielectric Paste | (4) | 3.6 | 3.0 | 3.2 |

(1) Dupont 9791
(2) ESL 9601
(3) Cermalloy 7029 D
(4) Dupont 9805

Analysis of the bond formed by the silver - palladium paste showed that a $CuAlO_2$ and/or $CuAl_2O_4$ layer was formed on top of the AlN substrate. Formed on top of this layer was a silver-copper eutectic layer, and on top of which was a silver palladium layer. The silver - copper eutectic layer was strongly bound to both of the $CuAlO_2$ and/or $CuAl_2O_4$ layer and the silver-palladium layer. The bonding mechanism was not clarified, but it is thought that strong bonds were formed with the oxides in the AlN substrate in a complex bonding relationship.

The dielectric paste also formed a strong bond with the substrate. It is thought that the glass component in the paste coupled with the oxides such as $Y_2O_3$ in the AlN substrate to form a strong bond. This paste contains a lead borosilicate glass ($B_2O_3$ - $SiO_2$ - PbO); it is thought that the PbO in particular plays an important role in the bonding.

EXAMPLE II

Yttrium oxide in an amount of 3% by weight containing 1.1% by weight of oxygen was added to AlN powder. After mixing and forming, the resulting product was sintered at 1800° C. under atmospheric pressure in a nitrogen gas atmosphere to obtain a dense AlN substrate. Parts of this AlN substrate was cut off for use as a test sample. The laser flash method was used to measure the thermal conductivity, giving a value of 120 W/mK, which is considered good.

Next, the surface of this AlN substrate was coated with gold paste (Dupont 9791). A pattern of electrically conductive paths of gold about 15 μm thick was formed, then fired for 10 minutes at 850° C. Then solder consisting, by weight, of 60% tin/35% lead/5% silver was used to solder a metallic wire of 1 mm in diameter to one of the electirically conductive paths. An Instron 1130 tension tester was used to pull on the metallic wire at a rate of 25 mm/sec to measure the bond strength. It was confirmed that the bond was strong, with a strength of 1 kg/mm² or more.

EXAMPLE III

Calcium oxide in an amount of 3% elemental calcium equivalent by weight was added to powdered AlN. After mixing and forming, the resultant product was sintered in a nitrogen atmosphere at 1750° C. under atmospheric pressure to produce a dense AlN substrate. The thermal conductivity of this AlN substrate was measured and found to be 110 W/mK, which is considred to be a good value.

The surface of this AlN substrate was coated with Ag- Pd paste (ESL 9601) and fired for 10 minutes at 930° C. to form a pattern of electrically conductive layers consisting of an approximately 10 μm thickness of Ag- Pd. The same type of measurement was carried out in this case as in EXAMPLE I, confirming that the bond strength was at least 1 kg/mm².

EXAMPLE IV

Samarium oxide in an amount of 1% elemental samarium equivalent by weight was added to AlN powder. After mixing and forming, the resultant product was sintered in a nitrogen gas atmosphere at 1800° C. under atmospheric pressure to form a dense AlN substrate. The thermal conductivity of this AlN substrate was measured and found to be 110 W/mK, which is considered to be a good value.

The surface of this AlN substrate was coated with copper paste (Cermalloy 7029D) and fired for 10 minutes at 930° C. to form a pattern of electrically conductive paths consisting of an approximately 15 μm thickness of copper. The same type of measurement as in the preceding example was carried out, showing that the bond strength was at least 1 kg/mm².

EXAMPLE V

Barium oxide in an amount of 0.5% elemental barium equivalent by weight was added to AlN powder. After mixing and forming, the resultant product was sintered in a nitrogen gas atmosphere at 1750° C. under atmospheric pressure to form a dense AlN substrate. The thermal conductivity of this AlN substrate was measured and found to be 80 W/mK, which is considered to be a good value.

The surface of this AlN substrate was coated with copper paste (Cermalloy 7029D) and fired for 10 minutes at 930° C. to form a pattern of electrically conductive paths consisting of an approximately 10 μm thickness of copper. The same type of measurement as in the preceding examples was carried out, showing that the bond strength was at least 1 kg/mm².

EXAMPLE VI

Yttrium oxide in an amount of 0.01% elemental yttrium equivalent by weight was added to powdered AlN in. After mixing and forming, the resultant product was sintered through pressing in a nitrogen gas atmosphere at 1800° C. and 300 kg/cm² to form a dense AlN substrate. The thermal conductivity was found to be 80 W/mK. As in the previous examples a pattern of electrically conductive layers was formed of gold paste, giving a bond strength of at least 1 kg/mm².

EXAMPLE VII

An AlN substrate containing 3% by weight of $Y_2O_3$ was subjected to an oxidative treatment in air at 1250° C. for one hour. The resulting AlN substrate had an $Al_2O_3$ layer of 6 μm thick formed on its surface.

A glass paste (Dupont 9805) was then applied to the substrate at predetermined positions, the binder was removed, and prebaking was effected at 350° C. for 5 minutes. A lead frame of 42 alloy was then placed on the substrate and baking was carried out at 420° C. for 10 minutes. Next, an IC chip was mounted and bonded, and a cap of alumina was sealed to the substrate by applying the same glass paste as above and baking at 420° C. for 10 minutes.

It was found that the glass layer established a good bond without any bubbles observable therein. Both the lead frame and the cap showed bond strengths of at least 500 grams as expressed in vertical load at rupture, which values are satisfactory in practical use. The thermal resistance was reduced 15% as compared with a similar CERDIP 28 pin package using alumina. This means that the package can receive an input of 1.2 watts while a corresponding aluminum package receives an input of 1 watt.

EXAMPLE VIII

An AlN substrate containing 5% of $Y_2O_3$ was subjected to an oxidative treatment by placing it in steam at 121° C. and 2 atmospheres and maintaining it there for 168 hours. A boehmite ($Al_2O_3$-like) film of 3 to 5 μm thick was formed on the substrate surface. Then, an Ag-Pd paste (ESL 9601) was printed in a given pattern, dried at 125° C. for 10 minutes, and then baked at 930° C. for 10 minutes, forming a conductive layer. Using a 250 mesh screen, resistive pastes (duPont 16 series 100k/sq., 1k/sq., and 1000k/sq.) were printed as a glass layer. Upon firing at 850° C. for 10 minutes in air, the resistors achieved a good bond without any bubbles formed therein and showed resistances within a deviation of ±15%.

EXAMPLE IX

In a comparative example, a resistor was formed on an AlN substrate which had not been subjected to an oxidative treatment. The resistors showed widely varying resistances with a deviation of ±30%. This tendency was true for those AlN substrates hot pressed without sintering aids.

EXAMPLE X

An AlN substrate was prepared by mixing 97 wt % of AlN powder with 3 wt% of yttrium oxide, molding the mixture, and sintering it in a nitrogen atmosphere at 1800° C. under atmospheric pressure. This AlN substrate had a satisfactory thermal conductivity as high as 120 W/mK.

Next, an Au paste containing PbO and $SiO_2$ (1.49 wt % Pb and 0.23 wt % Si) was applied onto the AlN substrate to form a conductive layer. Baking was carried out through drying in air at 120° C. for 10 minutes, and baking in air at 850° C. for 10 minutes, thereby forming a pad which serves as a conductive layer.

The bond strength was measured to be 1 to 2 kg/mm², indicatiang the formation of a firm bond.

EXAMPLE XI

For comparison purpose, an Au paste free of lead and silicon (Bi and Cd containing paste for use with alumina) was applied onto an AlN substrate to form a conductive layer. The conductive layer was readily peeled off in a test using a commercially available cellophane tape.

EXAMPLE XII

Another sample was formed for the purpose of comparison as follows;

Nickel oxide in an amount of 3% nickel equivalent by weight was added to AlN powder. After mixing and forming, the resultant product was sintered for 2 hours at 1800° C. and normal pressure. The bond strength of gold paste was on the order of 1 kg/mm², which is good, but the thermal conductivity was low, only 40 W/mK.

EXAMPLE XIII

Another example was formed for the purpose of comparison as follows;

Aluminum oxide in an amount of 3% aluminum equivalent by weight was added to powdered AlN. After mixing and forming, the resultant product was sintered through hot-pressing for 1 hour at 1800° C. and 300 kg/mm² pressure. Compared to the case including no aluminum oxide, the bond strength was somewhat increased, but the thermal conductivity was low, only about 30 W/mK.

EXAMPLE XIV

For comparison purpose, an AlN substrate was subjected to an oxidative treatment by immersing it in 10% phosphoric acid solution. An oxide film of 3 μm thick was formed on the substrate surface. A 325 mesh pattern of an Au paste (duPont 9791) was printed on this AlN substrate, allowed to stand at room temperature for 10 minutes, dried at 120° C. for 10 minutes, and then baked at 850° C. for 10 minutes. A glass paste (duPont 9950) was printed to form a dielectric layer having throughholes for conduction between upper and lower conductive layers, and baked by a similar process under the same conditions as above. The glass layer formed a good bond to the AlN substrate. This procedure was repeated three times, obtaining a three layer package. The package was sufficient in bond strength and highly reliable without shortcircuit between the layers.

EXAMPLE XV

On an AlN substrate (thermal conductivity 60 W/mK) prepared from an AlN powder containing 3 wt % of oxygen, a Cu paste containing PbO (1.49 wt % Pb atom) and $SiO_2$ (0.47 wt % Si atom) was applied to form a conductive layer. The procedcure of Example XV was repeated except that baking was carried out in a nitrogen atmosphere. The bond strength was satisfactory as shown by an average of 1.4 kg/mm². Also in this example, the migration and concentration of Pb and O was observed and no glass component was detected.

What is claimed is:

1. A high thermal conductivity circuit substrate, comprising (a) a sintered aluminum nitride ceramic substrate consisting essentially of at least one member selected from the group consisting of an oxide of yttrium, an oxide of a rare earth metal and an oxide of an alkali earth metal, said member present in an amount of from about 0.01% to about 15% of metal equivalent by weight, the balance being essentially aluminum nitride and incidental impurities and (b) a conductive path or layer made from electrically conductive thick film paste formed on said ceramic substrate;

wherein the bond strength between said circuit substrate and said conductive path or layer is at least about 1 kg/mm².

2. The high thermal conductivity circuit substrate of claim 1, wherein said conductive paste is selected from the group consisting of silver paste comprising silver, silver and platinum, or silver and palladium, copper paste, gold platinum paste and gold paste.

3. The high thermal conductivity circuit substrate of claim 2, wherein said conductive paste contains copper oxide.

4. The high thermal conductivity circuit substrate of claim 3, wherein the amount, in $Cu_2O$ equivalent, of copper oxide is from about 0.1% to about 30% by weight.

5. The high thermal conductivity circuit substrate of claim 1, wherein an intermediate layer containing copper, aluminium and oxygen is formed between said ceramic substrate and the thick film paste.

6. The high thermal conductivity circuit substrate of claim 1, wherein said conductive paste contains lead and silicon to bond said conductive path or layer to said circuit substrate in a chemical bond.

7. The high thermal conductivity curcuit substrate of claim 6, wherein the amount in metal element of lead and silicon is about 0.05% to about 5% by weight.

8. The high thermal conductivity circuit substrate of claim 6, wherein the amount in metal element of lead is up to about 4% by weight.

9. The high thermal conductivity circuit substrate of claim 6, wherein an intermediate layer containing lead, silicon and oxygen concentrated therein is formed between said circuit substrate and said conductive layer or path.

10. The high thermal conductivity circuit substrate of claim 9, wherein said intermediate layer containing lead, silicon and oxygen is from 0.5 μm to 20 μm thick.

11. The high thermal conductivity substrate of claim 6, wherein said member is yttrium oxide.

12. The high thermal conductivity circuit substrate of claim 1, wherein said circuit substrate has an oxide layer on the surface thereof.

13. The high thermal conductivity circuit substrate of claim 12, wherein a glass layer is bonded thereon.

14. The high thermal conductivity circuit substrate of claim 13, wherein said glass layer functions as a resistor.

15. The high thermal conductivity substrate of claim 13, wherein said member is yttrium oxide.

16. The high thermal conductivity circuit substrate of claim 12, wherein said oxide layer is 2 to 20 μm thick.

17. The high thermal conductivity substrate of claim 12, wherein said member is yttrium.

18. The high thermal conductivity substrate of claim 1, wherein said member is yttrium oxide.

19. The high thermal conductivity substrate of claim 18, wherein said conductive paste is a gold paste.

20. The high thermal conductivity substrate of claim 18, wherein said conductive paste is a silver-palladium paste.

21. The high thermal conductivity substrate of claim 18, wherein said conductive paste is a copper paste.

22. The high thermal conductivity substrate of claim 1, wherein said member is calcium oxide.

23. The high thermal conductivity substrate of claim 1, wherein said member is samarium oxide.

24. The high thermal conductivity substrate of claim 1, wherein said member is barium oxide.

25. A high thermal conductivity circuit substrate, comprising (a) a sintered aluminum nitride ceramic substrate consisting essentially of at least one member selected from the group consisting of an oxide of yttrium, an oxide of a rare earth metal and an oxide of an alkali earth metal, said member present in an amount of from about 0.01% to about 5% metal equivalent by weight, the balance being essentially aluminum nitride and incidental impurities and (b) a conductive path or layer made from electrically conductive thick film paste formed on said ceramic substrate;

wherein the bond strength between said circuit substrate and said conductive path or layer is at least about 1 kg/mm$^2$.

* * * * *